(12) United States Patent
Bieck et al.

(10) Patent No.: US 9,000,512 B1
(45) Date of Patent: Apr. 7, 2015

(54) PACKAGING OF ELECTRONIC CIRCUITRY

(71) Applicants: Florian Bieck, Newport (GB); Robert J. Montgomery, Marshfield Cardiff (GB)

(72) Inventors: Florian Bieck, Newport (GB); Robert J. Montgomery, Marshfield Cardiff (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/780,055

(22) Filed: Feb. 28, 2013

Related U.S. Application Data

(60) Provisional application No. 61/604,966, filed on Feb. 29, 2012.

(51) Int. Cl.
  *H01L 23/50* (2006.01)

(52) U.S. Cl.
  CPC .................................... *H01L 23/50* (2013.01)

(58) Field of Classification Search
  CPC . H01L 21/768; H01L 23/48; H01L 23/49822; H01L 23/49827; H01L 23/49833; H01L 23/49838; H01L 23/5389; H01L 23/642; H01L 23/645; H01L 27/14632; H01L 27/14687

USPC .......... 257/777, 773, 288, 327; 438/109, 637, 438/106, 118
  See application file for complete search history.

(56) References Cited

U.S. PATENT DOCUMENTS

| 6,690,845 | B1 * | 2/2004 | Yoshimura et al. ............. 385/14 |
| 2008/0315302 | A1 * | 12/2008 | Farrow et al. ................. 257/334 |
| 2012/0149148 | A1 * | 6/2012 | Dallesasse et al. ........... 438/107 |

* cited by examiner

*Primary Examiner* — Whitney T Moore
(74) *Attorney, Agent, or Firm* — Chapin IP Law, LLC

(57) ABSTRACT

An assembler receives a circuit device and a mass of conductive material such as a diode, metal material, etc. The assembler bonds a first facing of a circuit device to a substrate. Adjacent to the circuit device, the assembler bonds a first facing of the mass of conductive material to the substrate. The assembler applies an overmold layer of insulation material over the substrate adjacent the circuit device and the mass of conductive material. Subsequent to applying the overmold layer of insulation material, the assembler provides a conductive link between a second facing of the circuit device and a second facing of the mass of conductive material.

23 Claims, 15 Drawing Sheets

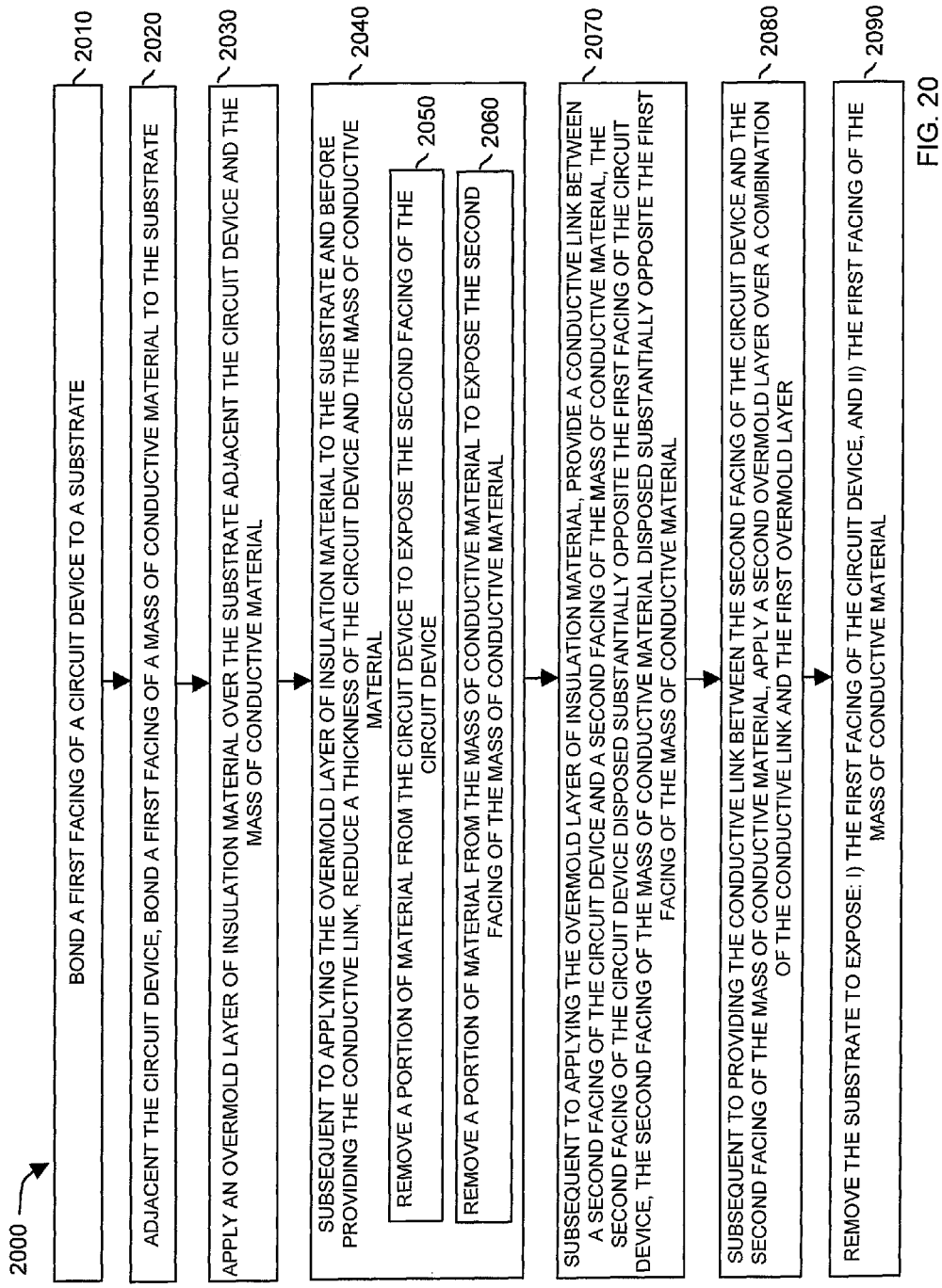

PACKAGING OF ELECTRONIC CIRCUITRY

RELATED APPLICATIONS

This application is related to and claims the benefit of earlier filed U.S. Provisional Patent Application Ser. No. 61/604,966 entitled "FANOUT WAFERLEVEL PACKAGING FOR POWERCHIPS," filed on Feb. 29, 2012, the entire teachings of which are incorporated herein by this reference.

BACKGROUND

Conventional Surface-Mount Technology (SMT) provides a way of interconnecting electronic circuit components. For example, according to conventional surface mount technology, electronic devices can be specifically packaged for subsequent mounting directly on a respective surface of a printed circuit board. Because of the advantages associated with surface mount technology such as smaller part size, surface mount technology has, to a large extent, replaced so-called through-hole technology in which wire leads of components are fitted and soldered into holes of a printed circuit board to alternatively provide connectivity.

Surface mount devices can be packaged according to a variety of different styles. For example, a surface mount device can have relatively small leads or no leads extending from the package at all. Because a surface mount device has relatively small leads or no leads at all, a surface mount device is usually smaller than its through-hole (e.g., pin-based) counterpart. The surface mount device may have short pins or leads of various styles, flat contacts, a matrix of solder balls (such as Ball Grid Arrays), or terminations on the body of the component.

According to one conventional application, surface mount devices also can be designed to include internal bond wires connecting nodes of an integrated circuit to pads of the surface mount device. The pads of the surface mount device can then be connected to a respective circuit board.

In many cases, the density of nodes on a semiconductor chip is so high that directly mounting the nodes of the chip to a corresponding circuit would be difficult if not impossible. As an alternative to utilizing conventional bond wires to provide connectivity, conventional techniques include creating so-called Fan-Out Wafer-Level (FOWL) type packages.

In accordance with conventional FOWL packaging techniques, each of one or more nodes residing on a single side of a semiconductor chip in an electronic circuit package extend outward via a respective fan-shaped conductive path to a corresponding solder ball or surface mount pad of a respective electronic circuit package encapsulating the chip. Thus, corresponding surface pads of the electronic circuit package can be sufficiently "fanned out" from a single side of the semiconductor chip such that it is possible to mount the electronic circuit package (and semiconductor chip therein) to a circuit board.

BRIEF DESCRIPTION

Conventional applications such as those as discussed above can suffer from a number of deficiencies. For example, conventional FOWL techniques apply only to chips in which all of the nodes of a semiconductor chip reside on the same side. In other words, conventional FOWL techniques do not lend themselves or apply when creating a fan-out wafer-level package for a two-sided circuit device (e.g., a chip having nodes on both facings).

Embodiments herein deviate with respect to conventional applications. For example, embodiments herein include novel circuit fabrication and packaging techniques to create electronic circuit devices including having at least one circuit node on each of multiple facings of a circuit device disposed in the electronic circuit package.

More specifically, in one embodiment, a wafer level assembler receives a circuit device such as a field effect transistor and a mass of conductive material such as a diode, metal material, etc. The assembler bonds a first facing of a circuit device to a substrate. Adjacent to the circuit device, the assembler bonds a first facing of the mass of conductive material to the substrate. The assembler applies an overmold layer of insulation material over the substrate adjacent the circuit device and the mass of conductive material. Subsequent to applying the overmold layer of insulation material, the assembler provides a conductive link between a second facing of the circuit device and a second facing of the mass of conductive material.

In accordance with further embodiments, subsequent to applying the overmold layer of insulation material to the substrate and before providing the conductive link between the circuit device and the mass of conductive material, the assembler: i) removes a portion of material from the circuit device to expose the second facing of the circuit device, and ii) removes a portion of material from the mass of conductive material to expose the second facing of the mass of conductive material. A portion of the overmold layer of insulation material also can be removed.

Further embodiments herein include a multi-layer wafer level assembly. By way of a non-limiting example, the multi-layer wafer level assembly includes a first layer and a second layer. The first layer includes a temporary fabrication substrate. The first layer may also include an adhesive layer. The second layer is in contact with the adhesive layer in the first layer. The second layer includes: a mass of conductive material, a circuit device, and insulation material. A thickness of the circuit device extends from a first surface region of the first layer to an exposed surface of the second layer disposed opposite the first layer. A thickness of the mass of conductive material extends from a second surface region of the first layer to the exposed surface of the second layer opposite the first layer. The insulation material is disposed in the second layer adjacent the circuit device and the mass of conductive material. The insulation material at least partially encapsulates the circuit device and the mass of conductive material in the second layer.

Yet further embodiments herein include a wafer level assembly including: a substrate, a circuit device, a mass of conductive material. A first facing of the circuit device is attached to the substrate. Adjacent the circuit device, a first facing of the mass of conductive material attached to the substrate. An overmold layer of insulation material is applied over the substrate adjacent to the circuit device and the mass of conductive material. The wafer level assembly can further include a conductive link or path of material such as metal or other suitable resource. The conductive link can be provided between a second facing of the circuit device and a second facing of the mass of conductive material subsequent to application of the overmold layer of insulation material over the substrate.

Embodiments herein are useful over conventional technology. For example, certain fan-out wafer level techniques as discussed herein support:

1.) producing electronic circuit packages of reduced size as a package can be just slightly larger than volume occupied by the outer dimensions of a circuit device such as a chip;

2.) producing electronic circuit packages at lower costs since many of the process steps can be done at a waferlevel, and most of the mechanical components are not discrete parts, but created in-situ on waferlevel;

3.) producing a switch device in an electronic circuit package to have lower $R_{DSON}$ values since the electrical pathway is minimized due to the small packages size;

4.) improving heat dissipation in an electronic circuit package since a heat dissipating elements can be integrated into the electronic circuit package;

5.) performing solderable front metal metallization at a later processing stage, reducing a cost of fabricating an electronic circuit package.

These and other more specific embodiments are disclosed in more detail below.

As discussed herein, techniques herein are well suited for use in different electronic circuit package applications such as field effect transistors, switches, semiconductor or circuit devices having input/output nodes on opposite facings, chips, etc. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details, summary, and/or possible perspectives (permutations) of the invention(s), the reader is directed to the Detailed Description section and corresponding figures, which includes a further summary of embodiments.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

FIG. 20 is an example diagram illustrating of a method of fabricating according to embodiments herein.

DETAILED DESCRIPTION AND FURTHER SUMMARY OF EMBODIMENTS

Figure 1:
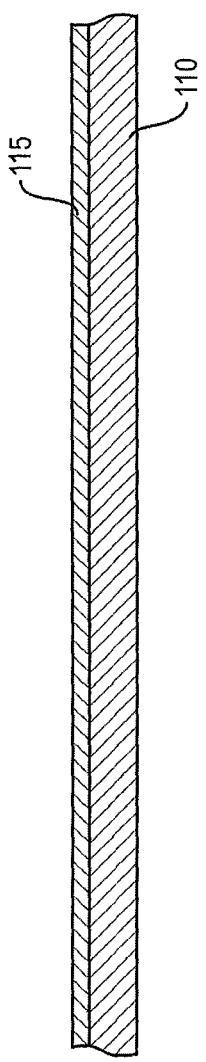
FIG. 1 is an example side view diagram of a temporary substrate and optional adhesive layer on which to perform wafer-level processing according to embodiments herein.

Now, more specifically, FIG. 1 is an example side view diagram of a temporary fabrication substrate on which to perform wafer-level processing according to embodiments herein.

In general, FIG. 1 shows a substrate 110 such as a glass plate or other suitable rigid or semiconductor-rigid material. In one embodiment, the substrate 110 is a temporary fabrication substrate on which to produce a wafer level circuit assembly as discussed herein.

By way of a non-limiting example, the substrate 110 can be circular (from top view) and have a diameter of 200 . . . 300 millimeters, and thickness of ~1 . . . 5 mm, which is typically sufficient for mechanical stability. These parameters may variable depending on the embodiment.

By further way of a non-limiting example, the substrate 110 may be substantially planar. That is, layer 110 and/or adhesive layer 115 can be substantially planar. In one example embodiment, on top of the substrate 110 is a laminated adhesive layer 115 such as an adhesive tape or other suitable resource, which adheres to the substrate 110.

Figure 2A:
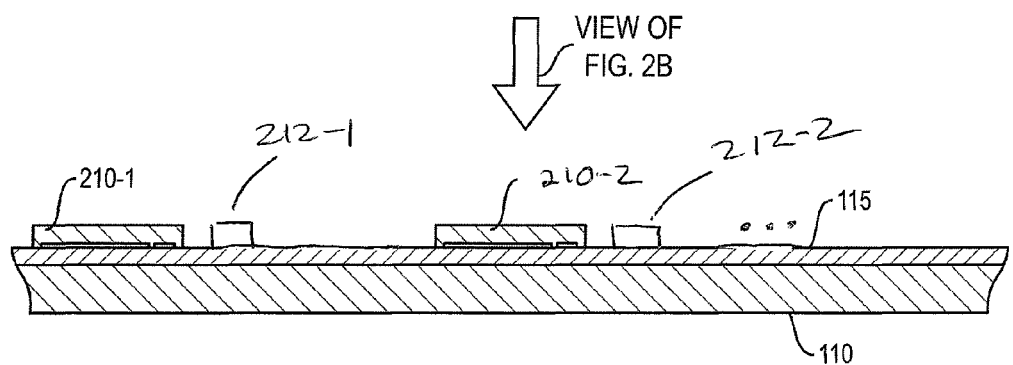
FIG. 2A is an example side view diagram of multiple circuit devices and adjacent masses of conductive material disposed on a temporary substrate according to embodiments herein.

FIG. 2A is an example side view diagram of multiple circuit devices and corresponding masses of conductive material disposed on a temporary substrate according to embodiments herein.

Embodiments herein can include a die-bonding operation in which one or more circuit devices 210 (e.g., circuit device 210-1, circuit device 210-2, etc.) such as power chips and masses of conductive material 212 (e.g., mass of conductive material 212-1, mass of conductive material 212-2, etc.) are bonded face down to the substrate 110 via adhesive layer 115.

By way of a non-limiting example, the circuit device may be a transistor device. The masses of conductive material 212 may be diodes, metal, etc. Implementation of the mass of conductive material 212-1 as a diode may be beneficial in high voltage applications.

In one embodiment, the adhesive layer 115 can ensure that the circuit devices 210 and masses of conductive material 212 properly adhere to the substrate 110.

In accordance with another embodiment, the group of circuit devices 210 can be part of a single circular wafer; a facing of which is coupled to the substrate 110 via the adhesive layer 115. Alternatively, the circuit devices 210 may be cut from a common wafer prior to being bonded to the substrate 110. In other words, the circuit devices 210 can be diced from a wafer prior to placement on the substrate 110.

In one embodiment, each of the circuit devices 210 initially may not have any kind of backside metal or node. Instead, the backside of the circuit devices 210 initially consists of doped silicon material associated with a respective circuit device 210.

By way of a non-limiting example, in one embodiment, the circuit devices 210 and/or the masses of conductive material 212 are not thinned down prior to bonding. For example, the circuit devices can have any suitable thickness such as a thickness of approximately more than 200 micrometers. In one embodiment, the starting thickness of the masses of conductive material 212 and the circuit devices 210 is between 700-1000 micrometers.

Such a thickness (e.g., greater than 300 micrometers) associated with circuit device 210-1 provides a reasonable amount of rigidity, preventing or reducing possible damage to the circuits while handling and placing on the substrate 110.

Figure 2B:
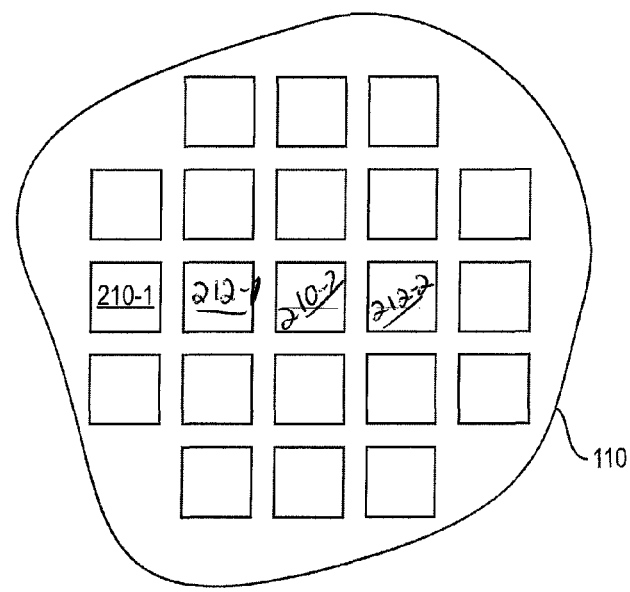
FIG. 2B is an example top view diagram of multiple circuit devices and adjacent masses of conductive material disposed on a temporary substrate according to embodiments herein.

FIG. 2B is an example top view diagram of the multiple circuit devices disposed on a temporary substrate 110 according to embodiments herein. As shown, pairings of circuit devices 210 and masses of conductive material 212 can be spaced apart as shown.

Figure 3:
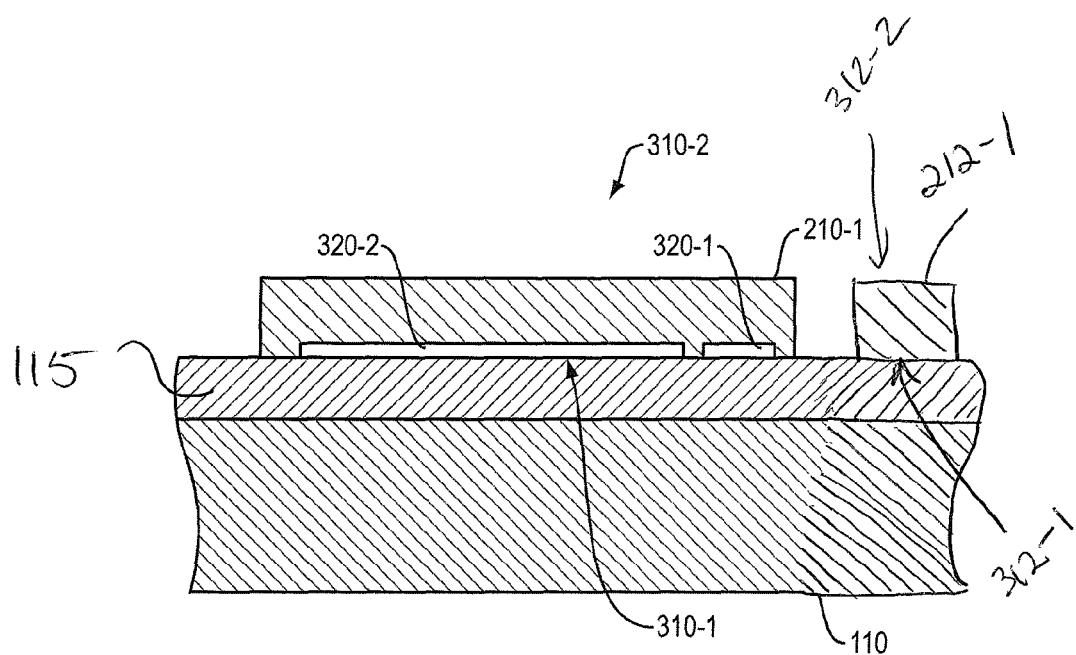
FIG. 3 is an example side view diagram of a circuit device and adjacent mass of conductive material disposed on a temporary substrate according to embodiments herein.

FIG. 3 is an example side view diagram of a circuit device disposed on a temporary substrate according to embodiments herein. Note that the following steps of processing the pairing of circuit device 210-1 and mass of conductive material 212-1 can apply to each of the pairings of circuit devices 210 and respective masses of conductive material 212 disposed on substrate 110. Thus, the pairings can be produced en masse.

In one embodiment, the circuit device 210-1 is a device having at least one input/output node on each of multiple facings or sides.

As typical for power chips, field effect transistor devices have a (relatively small gate) node 320-1 and the (relatively large source) node 320-2 on facing 310-1 of the circuit device 210-1. As shown, facing 310-1 of circuit device 210-1 is bonded to substrate 110 via adhesive 115 or other suitable material.

In one non-limiting example embodiment, the node 320-1 of circuit device 210-1 is a gate node of a remote source vertical field effect transistor; node 320-2 of the circuit device 210-1 is a source node of the field effect transistor. If not already present, a drain node of the field effect transistor can be formed in a backside of the circuit device 210-1 as further discussed below.

Mass of conductive material 212-1 includes a first facing 312-1 and a second facing 312-2. As shown, the first facing 312-1 is disposed substantially opposite the second facing 312-2. The facing of the mass of conductive material 312-1 is bonded to substrate 110 via layer 115. The thickness between facing 312-1 and facing 312-2 of the mass of conductive material 212-2 can be substantially the same or different than the thickness between facing 310-1 and facing 310-2 of the circuit device 210-1.

As mentioned, the thickness of the circuit device 210-1 and the mass of conductive material 212-1 can be sufficiently large to facilitate handling without damage.

Note that reference to the circuit device 210-1 as a field effect transistor is by way of a non-limiting example only. Notably, the circuit device 210-1 can be any suitable type of device having at least one node on facing 310-1 and at least one node on facing 310-2.

By way of a non-limiting example, as previously discussed, mass of conductive material 212-1 can be a diode. The mass of conductive material 212-1 can be n-doped silicon material. The facing 312-1 can be doped with p-material.

As an alternative example, the mass of conductive material 212-1 and facing 312-2 can be p-doped silicon material. The facing 312-1 can be doped with n-material to create a respective p-n junction in the mass of conductive material 312-1.

An orientation of the diode varies depending on whether the circuit device 210-1 is a p-type or n-type field effect transistor.

As yet another alternative embodiment, the mass of conductive material 212-1 can be made of metal such as or including copper, tin, aluminum, etc.

As discussed below, the facing 310-2 can be modified before creating a source node associated with the circuit device 210-1. However, note that certain embodiments herein include a circuit device 210-1 that already has one or more nodes disposed on a backside of the circuit device 210-1. In other words, the facing 310-2 of the circuit device can already have one or more nodes, eliminating the need to perform additional processing steps to create them.

Figure 4A:
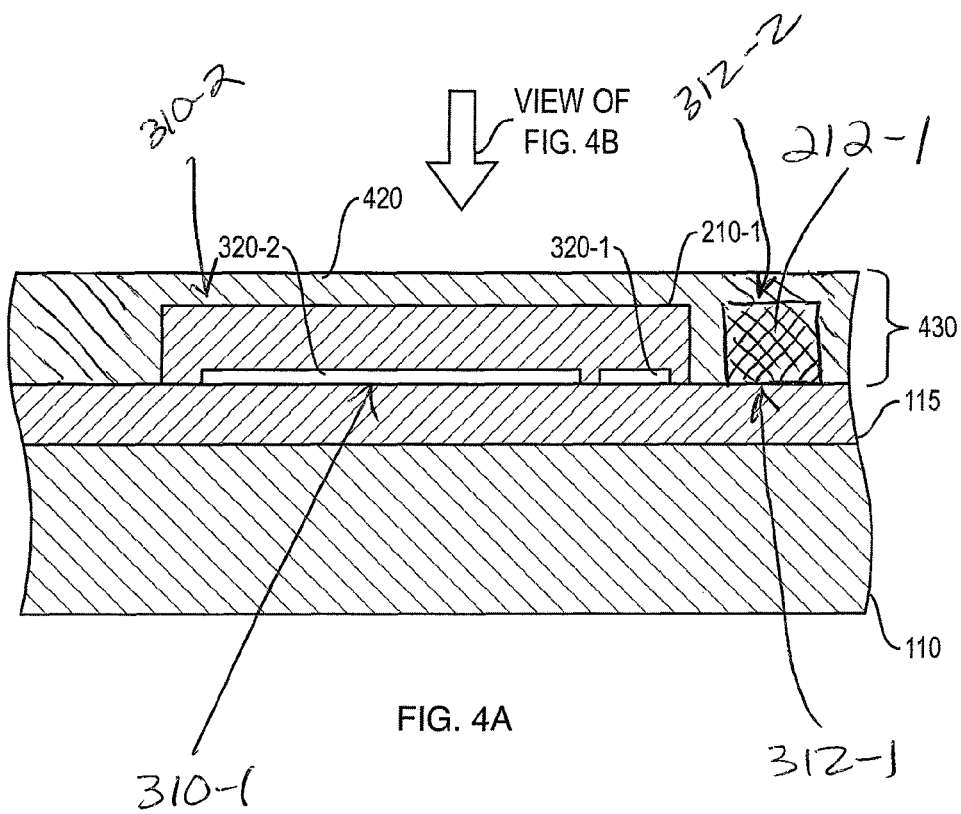
FIG. 4A is an example side view diagram of a circuit device and a mass of conductive material disposed on a temporary substrate and application of a first overmold according to embodiments herein.

FIG. 4A is an example side view diagram of a circuit device disposed on a temporary substrate and application of a first overmold layer according to embodiments herein.

In accordance with one embodiment, the facing of the substrate 110 on which the circuit devices 210 and the masses of conductive material 212 are mounted is overmolded with a non-electrically conductive overmold material 420 such as a non-electrically conductive resin such as epoxy resin or other suitable material to produce overmold layer 430. Overmold layer 430 can be rigid or semiconductor-rigid material. Initially, the overmold material 420 may be liquid or semi-liquid that cures into a solid.

This overmolding via overmold layer 430 can be done in a way that regions such as facings 310-1 and facing 312-1 are not filled with the overmold material 420. In one embodiment, this is achieved by use of a mold chase with blocks at these regions.

Embodiments herein can include: filling a volume between the circuit device 210-1 and the mass of conductive material 212-1 with the insulation material (e.g., overmold material 420). Presence of the circuit device 210-1 prevents the overmold layer 430 from occupying a first region (e.g., facing 310-1) on a surface of the substrate 110 between the circuit device 210-1 and the substrate 110. Presence of the mass of conductive material 212-1 prevents the insulation material (e.g., overmold material 420) of the overmold layer 430 from occupying a second region (e.g., facing 312-1) on the surface of the substrate 110 between the mass of conductive material 212-1 and the substrate 110.

By way of further non-limiting example, as shown, the mass of conductive material 212-1 resides to the right of the circuit device 210-1. However, note that other configurations are feasible as well.

At this stage, most of the backside (e.g., facing 310-2) of circuit device 210-1 and the backside (e.g., facing 312-2) of mass of conductive material 212-1 is encapsulated by overmold material 420 (e.g., mold compound). In one embodiment, the overmold layer 430 is approximately 100-200 micrometers above the top surface (e.g., facing 310-2) of the circuit device 210-1. However, it should be noted that the overmold layer 430 may be any suitable thickness. For example, the thickness of the overmold layer 430 may be the different than a thickness of the circuit device 210-1 and/or mass of conductive material 212-1. The thickness of the overmold layer 430 may be substantially the same as the thickness of the circuit device 210-1 and/or mass of conductive material 212-1.

Figure 4B:
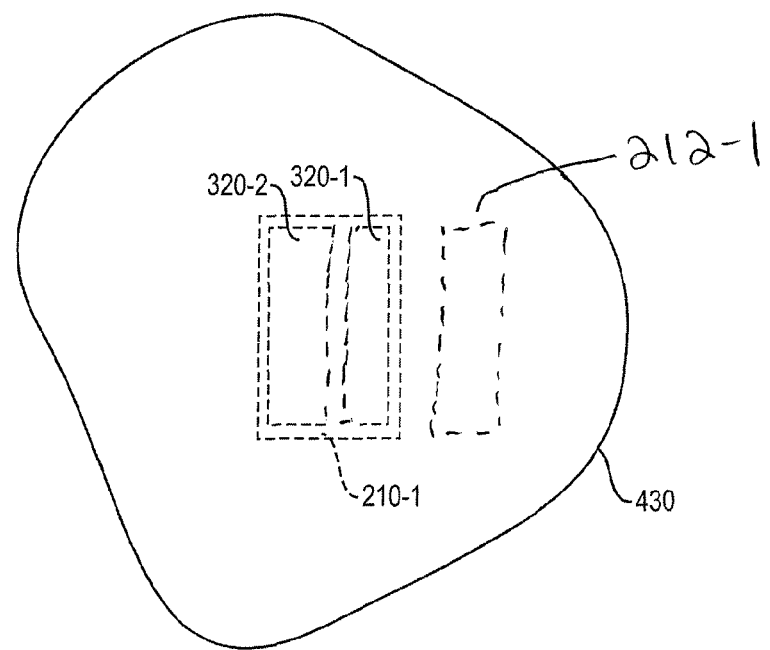
FIG. 4B is an example top view diagram of a circuit device and mass of conductive material disposed on a temporary substrate and first overmold according to embodiments herein.

FIG. 4B is an example top view diagram of a circuit device and corresponding mass of conductive material disposed on a temporary substrate and application of a first overmold layer according to embodiments herein. Although nodes 320 are shown as being channel-like through overmold layer 430, their placement with respect to the circuit device 210-1 and shape can vary depending on the application.

Figure 5A:
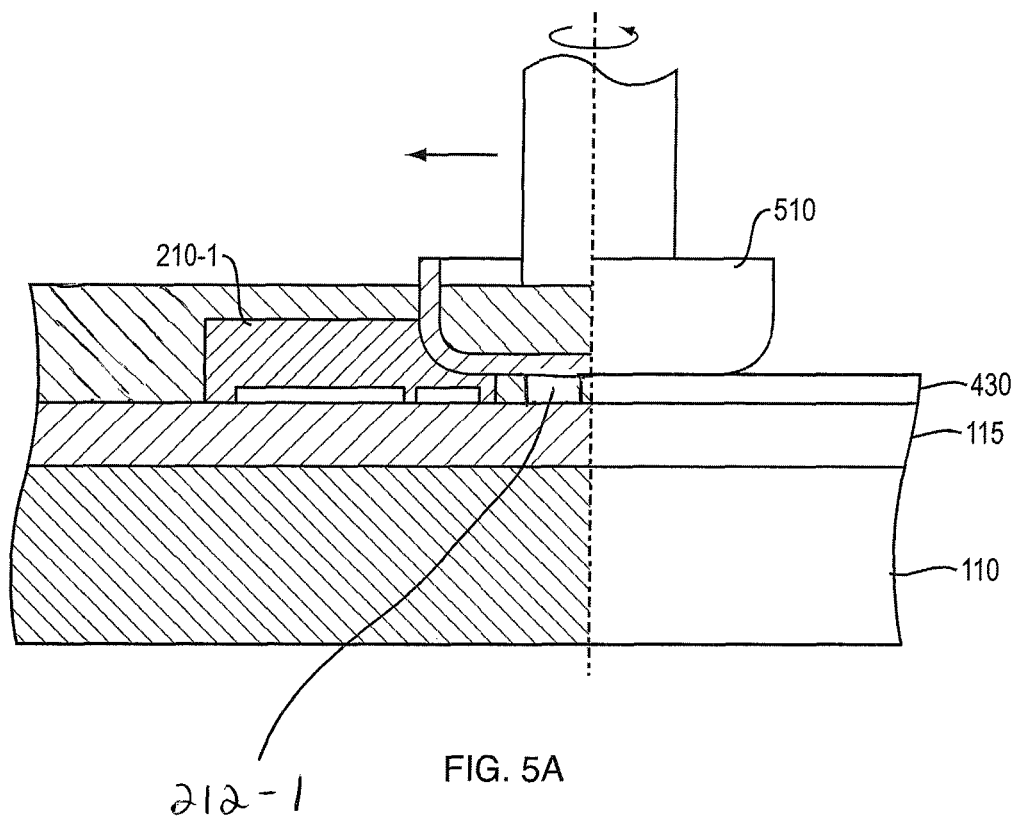
FIG. 5A is an example side view diagram illustrating removal of material from a wafer level assembly according to embodiments herein.
Figure 5B:
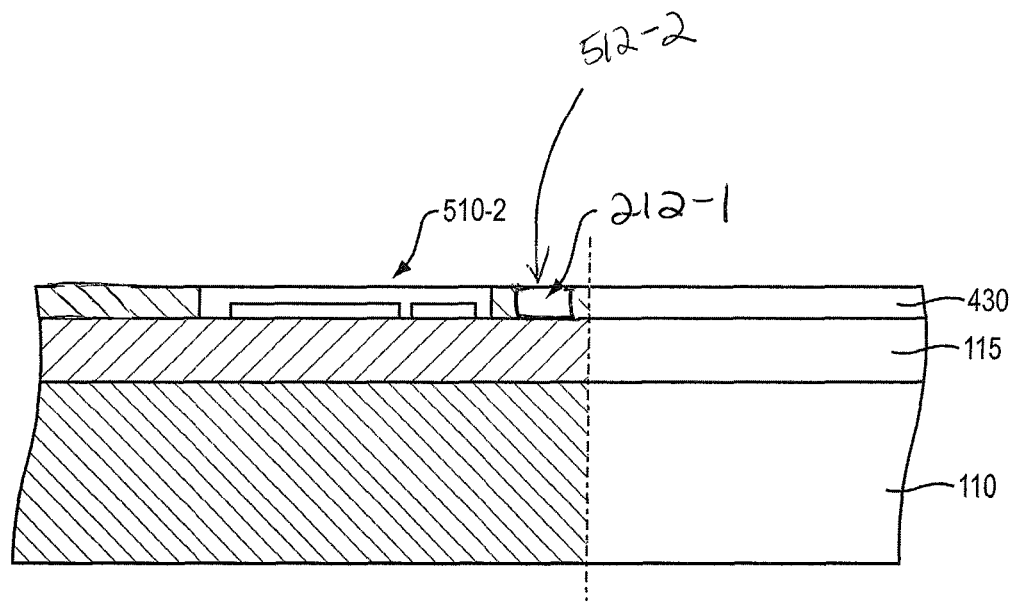
FIG. 5B is an example side view diagram of the circuit device and mass of conductive material disposed on the temporary substrate after removal of material according to embodiments herein.

FIG. 5A is an example side view diagram illustrating removal of material according to embodiments herein. FIG. 5B is an example side view diagram of a thinned version of the circuit device and corresponding mass of conductive material disposed on the temporary substrate after removal of material according to embodiments herein.

As shown in FIG. 5A, planer tool 510 such as a spinning grinder wheel passes over a top of wafer level assembly including the exposed side of circuit device 210-1 and the mass of conductive material 212-1. The planer tool 510 removes a portion of the overmold layer 430, a portion of circuit device 210-1, and a portion of mass of conductive material 212-1. This reduces a thickness of the circuit device 210-1, corresponding mass of conductive material 212-1, and layer of insulation material.

In one embodiment, the material removal results in a final thickness of a combination of the circuit device 210-1, corresponding mass of conductive material 212-1, and the overmold layer 430 is any suitable value such as between approximately 5-500 micrometers. The original thickness prior to thinning may be greater than 500 micrometers.

In one embodiment, the thickness of the circuit device 210-1 directly affects performance and parameters of the circuit device. For example, assuming the circuit device 210-1 is a so-called vertical field effect transistor, the $R_{DSON}$ of the circuit device 210-1 varies depending on thickness between facing 310-1 and facing 310-2. Reducing the thickness reduces the $R_{DSON}$ parameter of the respective field effect transistor.

Subsequent to backgrinding of the circuit device 210-1 using planar tool 510, the top surface of the circuit device 210-1 and overmold layer 430 can be cleaned to remove any unwanted residue.

Thereafter, embodiments herein include exposing the top surface that was just grinded and cleaned to a plasma silicon etch process in order to remove a stressed layer on the surface resulting from backgrinding.

After backgrinding and cleaning, newly exposed facing 510-2 of circuit device 210-1 and newly exposed facing 512-2 of the mass of conductive material 212-1 is exposed on a topside of the wafer level assembly.

In one non-limiting example embodiment, subsequent to grinding, the layer 430 can be between 5 and 300 micrometers thick.

Figure 6:
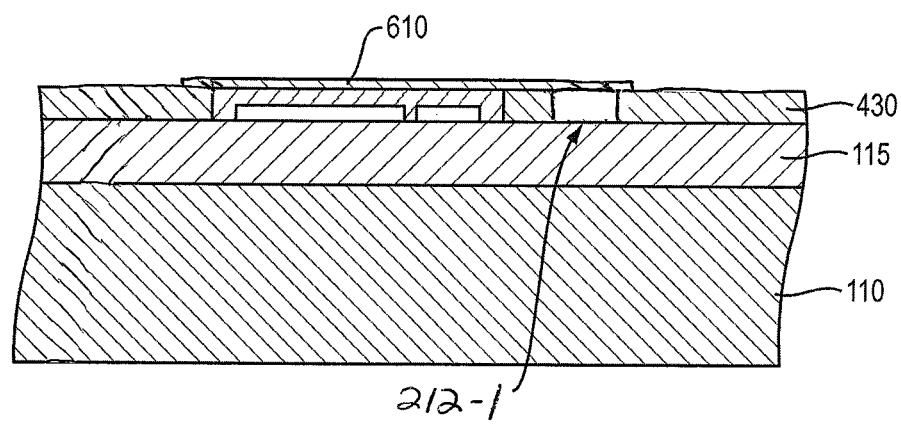
FIG. 6 is an example side view diagram illustrating application of a layer of electrically conductive material over a wafer level assembly according to embodiments herein.

FIG. 6 is an example side view diagram illustrating application of a layer of electrically conductive material according to embodiments herein.

In accordance with further embodiments, the next step in processing can include depositing a layer of material 610 such as metal or other suitable material over: the newly exposed surface facing 510-2 of the circuit device 210-1, the newly exposed surface facing 512-2 of the circuit device 212-1, and the thinned portion of overmold layer 430 as shown.

By way of a non-limiting example, one purpose of the layer of material 610 or metal layer is to provide and/or create an ohmic contact such as a drain node at the backside (i.e., newly exposed facing 510-2 as a result of grinding) of the circuit device 210-1. In other words, in one embodiment, the layer of material 610 provides an ohmic contact to silicon of the circuit device 210-1 on the newly exposed area (e.g., facing 510-2) produced by grinding.

Because the layer of material 610 is electrically connected to the facing 512-2 of the mass of conductive material 212-1, a combination of the layer of material 610 (e.g., a conductive link) and the mass of conductive material 212-1 provides an electrically conductive path between the facing 510-2 of the circuit device 210-1 and the facing 312-1.

If the mass of conductive material 212-1 is a diode, the layer of material 610 such as metal provides and/or creates an ohmic contact with respect to facing 512-2 of mass of conductive material 212-1.

The applied layer of material 610 is part of an electrically conductive path or conductive link from the backside (such as a drain node) or facing 510-2 of the circuit device 210-1 to the facing 512-2 on the surface of mass of conductive material 512-2.

As mentioned, the thinning of the circuit device 210-1 can produce a lower $R_{DSON}$ for a respective field effect transistor. Thus, thinning after providing the overmold layer 430 is useful. Applying the overmold layer 430 prior to thinning ensures that the insulation material does not form on facings 510-2 and facing 512-2.

The layer of material 610 can be created in any suitable manner. For example, in one embodiment, the layer of material 610 can be a metal layer created via any suitable technique such as:

i) depositing a Ti layer as barrier layer by PVD,
ii) depositing a Cu layer as seed layer by PVD,
iii) electro-deposition of Cu in the range of 5 to 7 micrometers or any suitable thickness, etc.

If desired, the layer of material 610 can be relatively thick in order to produce a sufficiently conductive path or conductive link from the backside of facing 510-2 of the circuit device 210-1 to the facing 512-2 of the mass of conductive material 212-1.

Figure 7A:
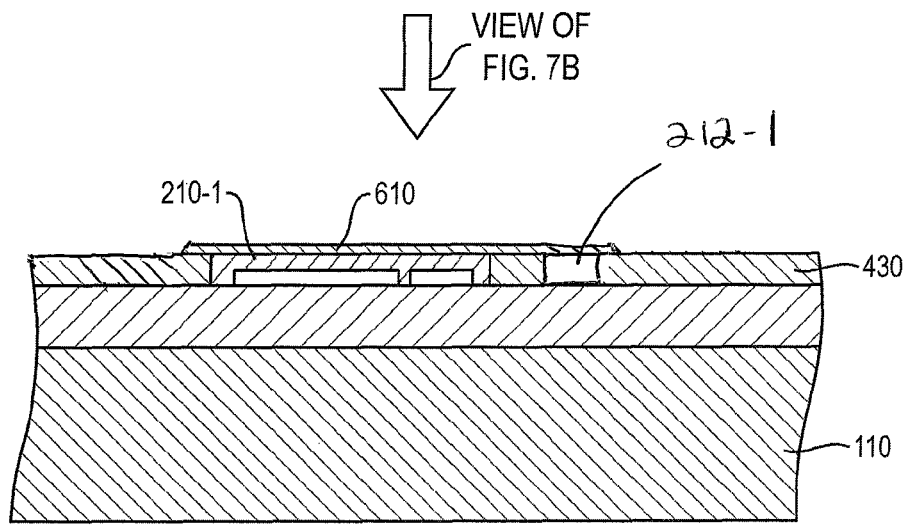
FIG. 7A is an example side view diagram illustrating a wafer level assembly disposed on a temporary substrate according to embodiments herein.
Figure 7B:
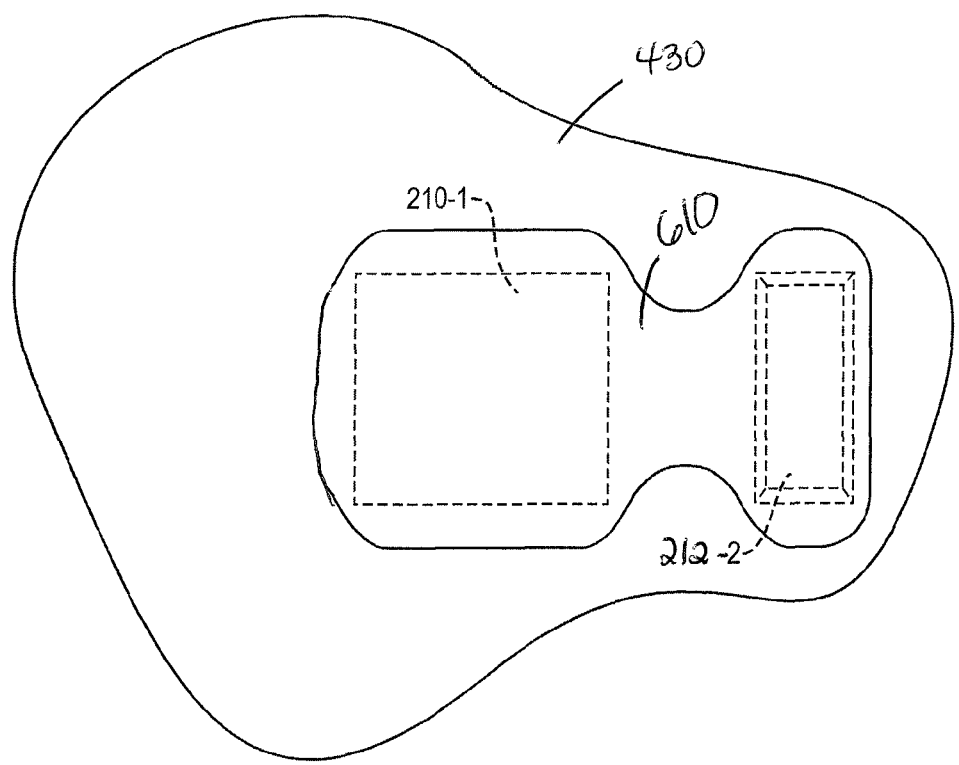
FIG. 7B is an example top view diagram illustrating a conductive layer connecting a circuit device and corresponding mass of conductive material disposed on a temporary substrate according to embodiments herein.

FIG. 7A is an example side view diagram illustrating a circuit device disposed on a temporary substrate according to embodiments herein. FIG. 7B is an example top view diagram illustrating a circuit device and coverage provided by the length of conductive material 610 disposed over the circuit device 210-1 and mass of conductive material 212-1 of the overmold layer according to embodiments herein.

As previously discussed, embodiments herein include providing a localized layer of material 610 over a combination of: the circuit device 210-1, the mass of conductive material 212-1, and a portion of exposed overmold layer 430.

In accordance with yet further embodiments, fabrication of the localized layer can include covering the layer of material 610 around the circuit device 210-1 with a photoresist spin or spray coating. Then, the layer of material 610 is etched, and finally the resist over the circuit device 210-1 is stripped away, exposing layer of material 610. FIG. 7B shows a top view of the layer of material 610 (over the circuit device 210-1 and mass of conductive material 212-1) remaining after etching. For example, the layer of material 610 remains in areas where it is required to form an electrical connection from the drain node of the circuit device 210-1 to the facing 512-2 of the mass of conductive material 212-1 in the overmold layer 430. This optional step of localizing ensures that each pairing of the circuit devices 210 and masses of conductive material 212 are electrically isolated from each other.

Figure 8:
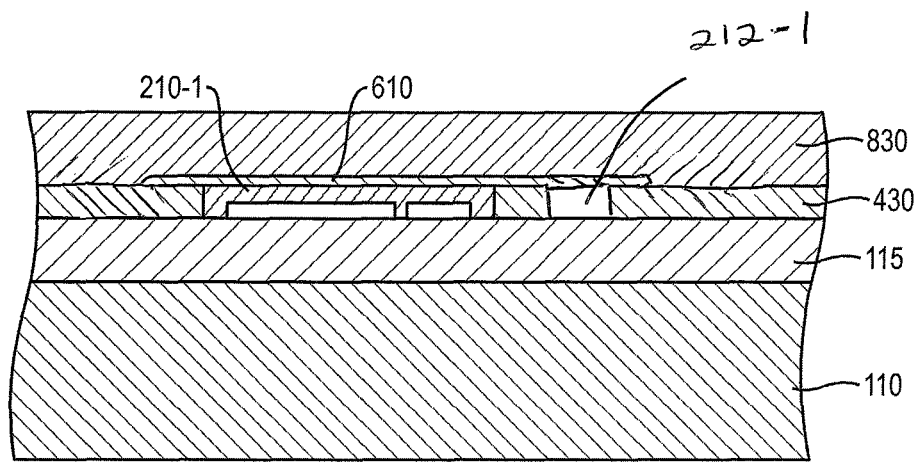
FIG. 8 is an example side view diagram of a circuit device disposed on a temporary substrate and application of a second overmold layer according to embodiments herein.

FIG. 8 is an example side view diagram of a circuit device disposed on a temporary substrate and application of a second overmold layer according to embodiments herein.

In one embodiment, fabrication includes providing a second overmold layer 830 as shown. The overmold layer 830 contacts layer of material 610. Because the layer of material 610 is localized, portions of the second overmold layer also contact the overmold layer 430 in areas radially outward from the circuit device 210-1.

As a result of applying the supplemental overmold layer 830, a combination of: the backside of the circuit device 210-1, mass of conductive material 212-1, and layer of material 610 becomes encapsulated. By way of a non-limiting example, the overmold layer 830 can be any suitable thickness. By way of a non-limiting example, the thickness of the overmold layer 830 of insulation material can be approximately 500 to 1500 micrometers or any other suitable value.

Figure 9:
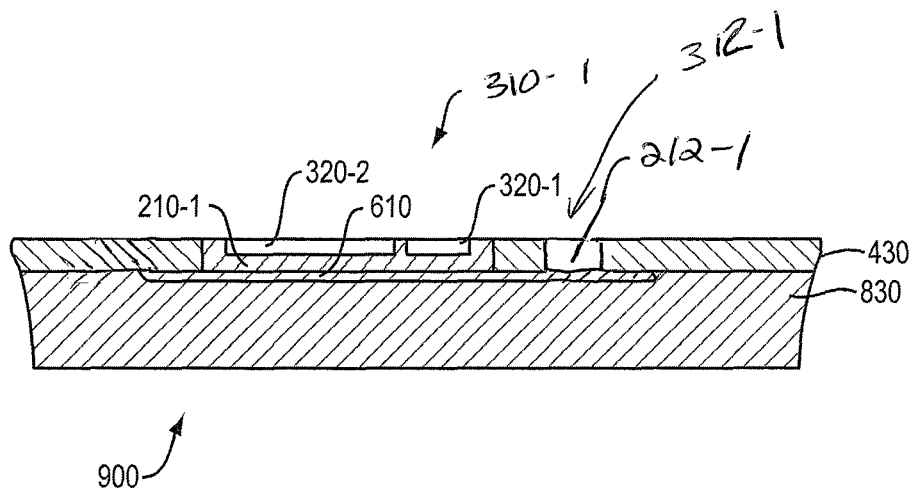
FIG. 9 is an example side view diagram illustrating flipping of a circuit assembly subsequent and removal of the temporary substrate according to embodiments herein.

FIG. 9 is an example side view diagram illustrating a circuit assembly subsequent to removal of the temporary substrate according to embodiments herein.

As shown in FIG. 9, the substrate 110 and the adhesive layer 115 can be removed via any suitable fabrication process.

In one embodiment, the layers of circuit assembly 900 (e.g., overmold layer 830 such as a resin, layer of material 610 such as a metal, etc.) provide stability with respect to the circuit device 210-1, which may otherwise be quite thin and fragile on its own.

Removal of the substrate 110 and adhesive layer 115 exposes facing 310-1 of the circuit device 210-1 and facing 312-1 of the mass of conductive material 212-1. Accordingly, node 320-1 and node 320-2 of circuit device 210-1 as well as facing 312-1 of the mass of conductive material 212-1 are exposed.

Via the conductive path or conductive link of metal 610 extending from the facing 510-2 of the circuit device 210-1 to the facing 512-2 of the mass of conductive material 212-1, the drain node (facing 510-2) disposed on the backside of the circuit device 210-1 is thus electrically connected to the exposed facing 312-1 of mass of conductive material 212-1.

In one embodiment, facing 312-1 resides on a substantially same plane as exposed nodes 320-1 and 320-2.

From this point on, by way of a non-limiting example, because the gate node (e.g., node 320-1), source node (e.g., node 320-2), and drain node (e.g., facing 312-1) reside in substantially the same plane, the whole configuration can be processed with conventional bumping or redistribution (e.g., RDL) methods.

Figure 10:
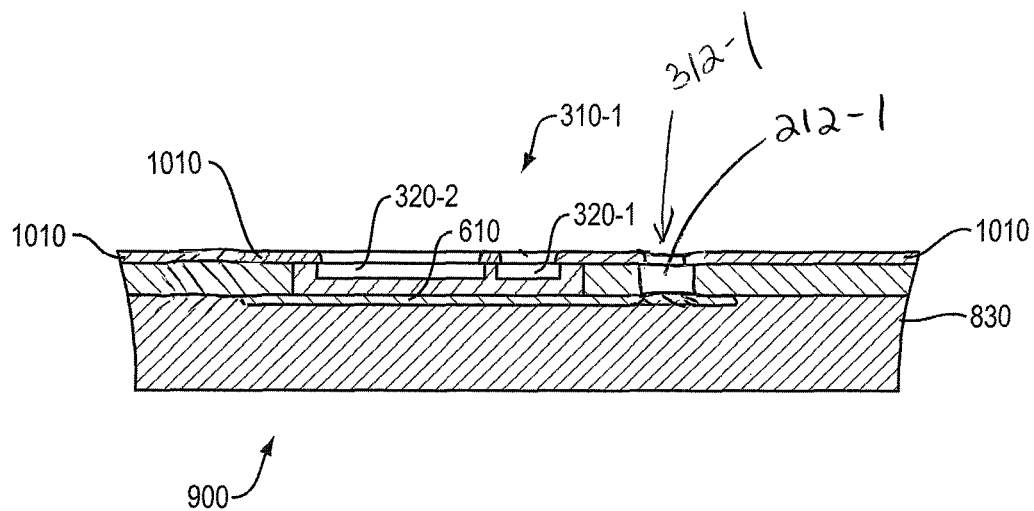
FIG. 10 is an example side view diagram illustrating application of a layer of insulation material to a circuit assembly according to embodiments herein.

FIG. 10 is an example side view diagram illustrating application of a layer of material according to embodiments herein.

As shown in FIG. 10, further fabrication of circuit package assembly 900 includes applying a layer of material 1010 such as a polyimide layer over at least a portion of exposed facing 310-1, exposed facing 312-1, and adjacent areas. In one embodiment, as shown, the facing 312-1 and nodes 320-1 and 320-2 remain substantially exposed after applying the layer of material 1010.

Figure 11:
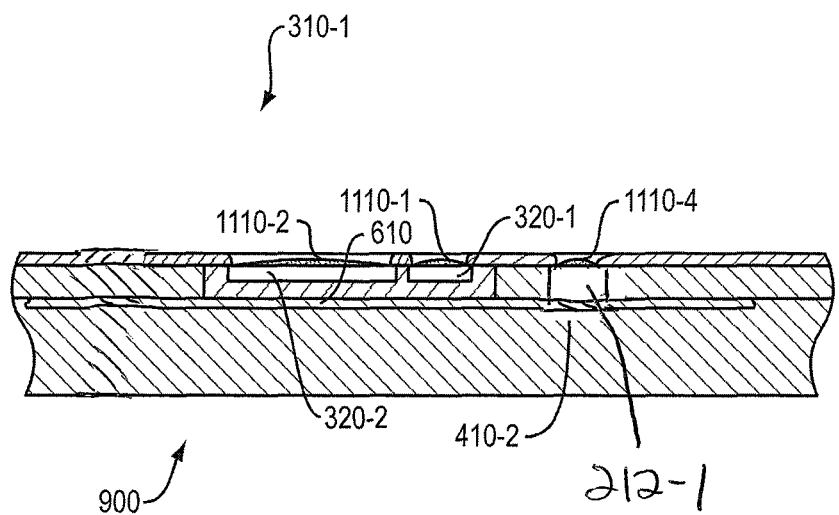
FIG. 11 is an example side view diagram illustrating application of a solderable metal to a surface of a circuit assembly according to embodiments herein.

FIG. 11 is an example side view diagram illustrating application of metal to nodes of circuit assembly according to embodiments herein.

As shown in FIG. 11, further fabrication of assembly 900 includes applying a layer of material 1110-2 over exposed surface of node 320-2, applying layer of material 1110-1 over exposed surface of node 320-1, applying layer of material 1110-4 over exposed surface (e.g., all or part of facing 312-1) of mass of conductive material 212-1.

By way of a non-limiting example, the layer of material 1110 can be solderable and/or metal material that is deposited in a vicinity of facing 312-1 and exposed nodes 320 on facing 310-1.

Figure 12:
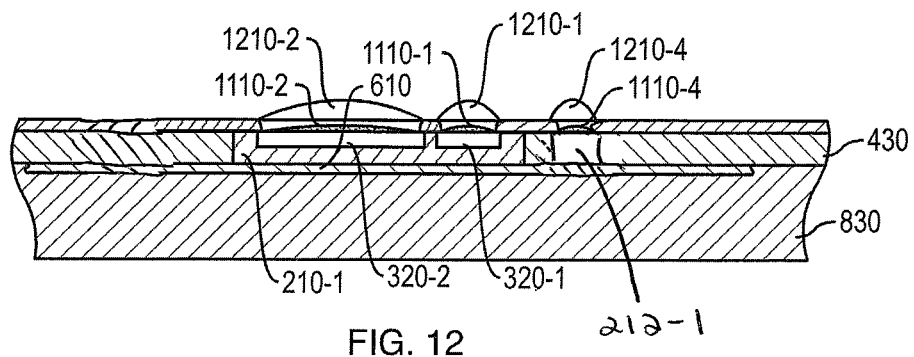
FIG. 12 is an example side view diagram illustrating deposition of conductive bumps on a circuit assembly according to embodiments herein.

FIG. 12 is an example side view diagram illustrating deposition of bumps on a circuit assembly according to embodiments herein.

As shown in FIG. 12, further fabrication of assembly 900 includes applying additional material over layer of material 1110 to produce respective contacts 1210 such as electrically conductive bumps. In one embodiment, the fabrication process includes creating contacts via electrochemical deposition or other suitable method.

In this example embodiment, the contact 1210-2 provides connectivity to node 320-2; the contact 1210-1 provides connectivity to node 320-1; the contact 1210-4 provides connectivity to mass of conductive material 212-1.

Figure 13A:
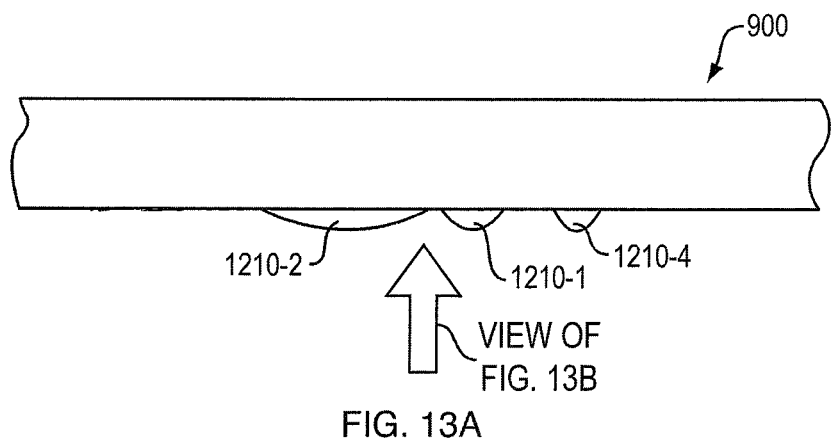
FIG. 13A is an example side view diagram of an electronic circuit package according to embodiments herein.
Figure 13B:
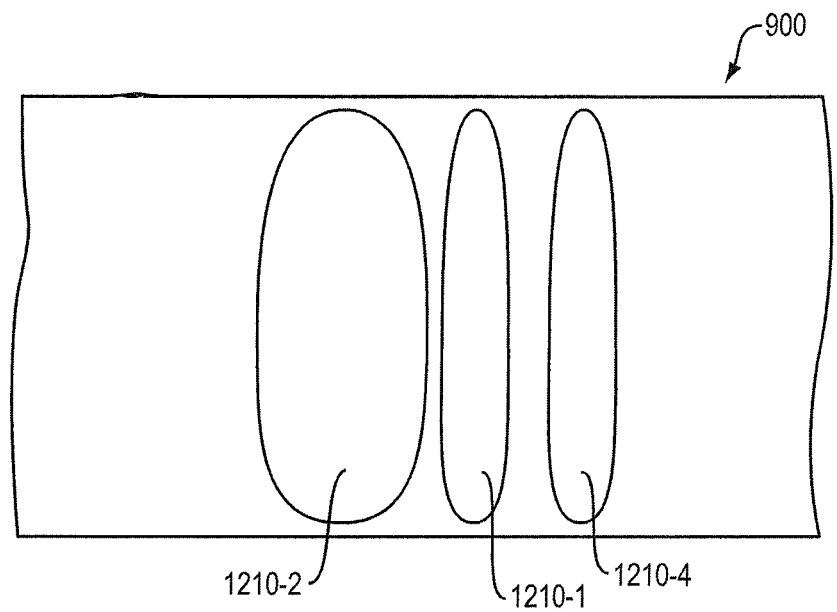
FIG. 13B is an example under view diagram of an electronic circuit package according to embodiments herein.

FIG. 13A is an example side view diagram of an electronic circuit package according to embodiments herein. FIG. 13B is an example top view diagram of an electronic circuit package according to embodiments herein.

As shown, FIG. 13A shows a singulated and finished assembly 900 as an electronic circuit package. The assembly can be mounted to a respective printed circuit board using surface mount technology. As shown in FIG. 13B, the assembly 900 can include a source node (e.g., contact 1210-2), a drain node (e.g., contact 1210-4), a drain node (e.g., contact 1210-1) that is fully compatible to surface mount technology.

Alternative Embodiments Using a Plate Instead of a 2nd Overmold Layer 830

As alternative to processing as discussed above in FIG. 8, embodiments herein can include continuing processing after FIG. 6 or FIG. 7 with all or a portion of the processing as discussed below. The additional processing in FIGS. 9-12 can be used to remove the substrate 110 and adhesive layer 115 and to produce an electronic circuit package in a manner as previously discussed.

In lieu of the overmold layer 830, a respective electronic circuit package can include a metal plate, heat sink, etc., as discussed below.

For example, instead of using an overmold layer 830, a plate (of a material such as metal) can provide rigidity to an electronic circuit assembly. The benefit of using a plate instead of the overmold layer 830 is shown by the better thermal properties of metal or steel, so this variation is most suitable for power-type chips (e.g., field effect transistors, etc.) operating in a higher power application.

Figure 14:
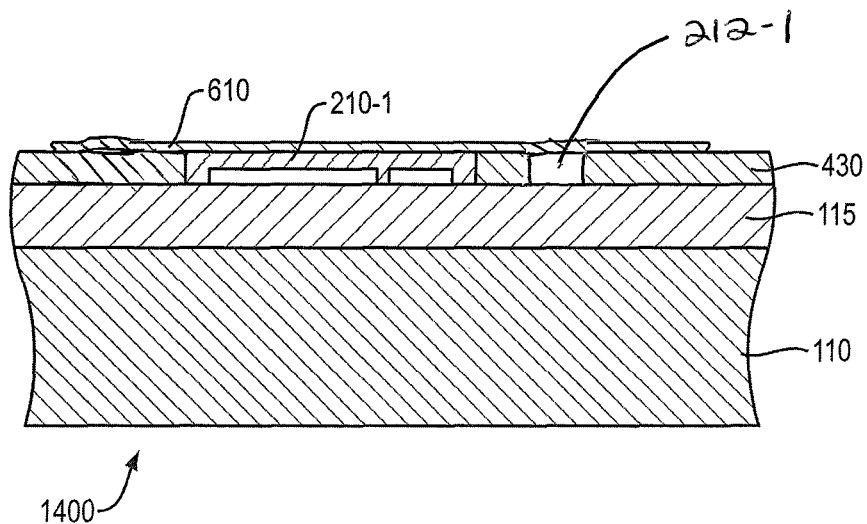
FIG. 14 is an example side view diagram illustrating deposition of a uniform layer of metal on a surface of an electronic circuit assembly according to embodiments herein.

FIG. 14 is an example side view diagram illustrating deposition of a uniform layer of metal on a surface of an electronic circuit assembly according to embodiments herein.

As shown, assembly 1400 includes layer of material 610 creating ohmic contacts to the backside of the circuit device 210-1 and mass of conductive material 212-1. As previously discussed, the layer of material 610 provides connectivity from the ohmic contact on the backside of the circuit device 210-1 to the mass of conductive material 212-1.

Figure 15:
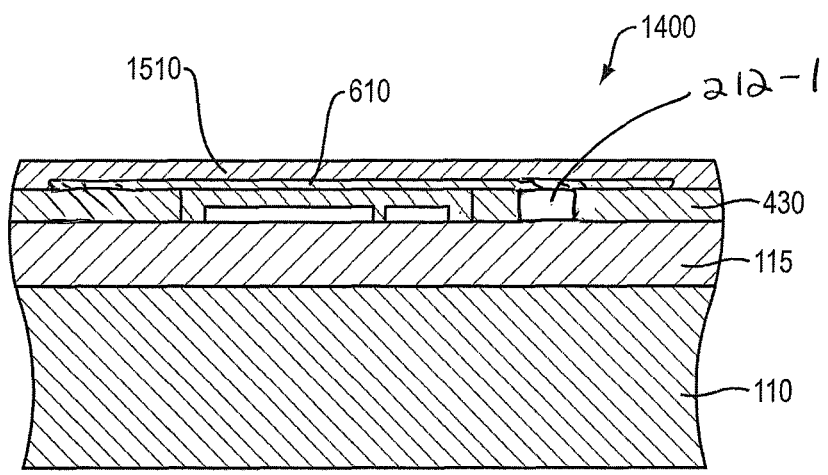
FIG. 15 is an example side view diagram illustrating application of an adhesive layer according to embodiments herein.

FIG. 15 is an example side view diagram illustrating application of an adhesive layer according to embodiments herein.

As shown, further processing of assembly 1400 includes applying a conductive adhesive layer 1510 over the layer of material 610 and/or surrounding exposed areas. In one embodiment, fabrication includes applying the conductive adhesive layer 1510 (e.g., thermally and/or electrically conductive material) via a process such as a stencil printing. By further way of a non-limiting example, the conductive adhesive layer 1510 may be uniform. That is, it may not have any structure or openings. Applying the conductive adhesive layer 1510 via an operation such as stencil printing ensures that the conductive adhesive layer fills in any voids in the overmold layer 430.

Figure 16:
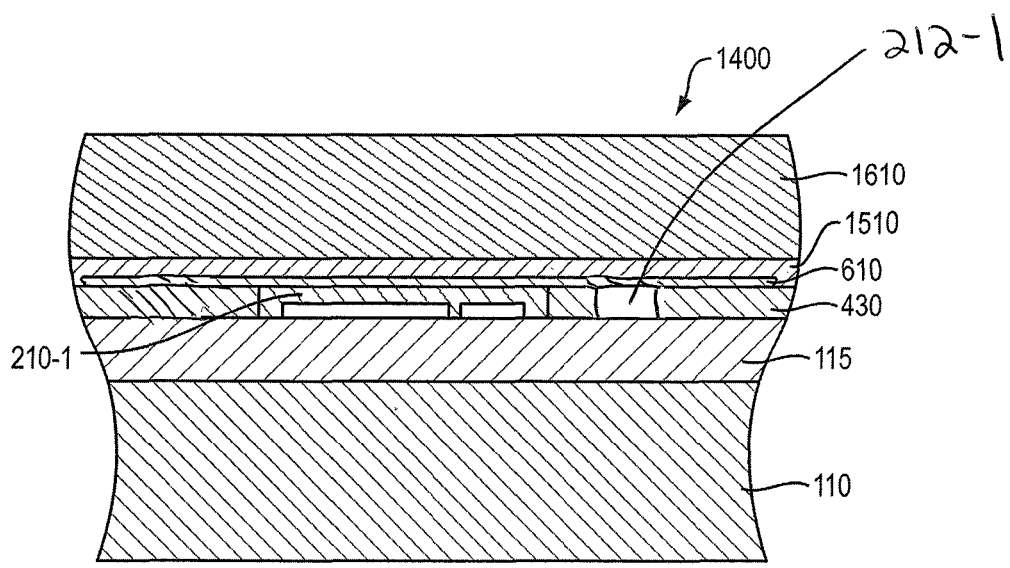
FIG. 16 is an example side view diagram illustrating a plate bonded to a topside surface of a circuit assembly according to embodiments herein.

FIG. 16 is an example side view diagram illustrating a plate 1610 bonded to a surface of a circuit assembly 1400 according to embodiments herein.

In one embodiment in which the conductive adhesive layer 1510 is electrically conductive, it will also have good thermal conductive properties. For example, it will readily support a transfer of heat away from the circuit device 210-1. In one embodiment, heat generated by the circuit device 210-1 will be conducted from the circuit device 210-1 through the adhesive layer 1510 to the plate 1610. The plate 1610 dissipates the heat to the ambient air by Eiher forces or natural convection.

Examples of different possible shapes of the plate 1610 as a heat sink are shown in FIGS. 18A, 18B, 18C, and 18D.

Note again that embodiments herein can further include the processing in FIGS. 9-12 to perform operations such as removal of the substrate 110 and adhesive layer 115 from assembly 1400, adding of contacts 1210, etc., to create a respective packaged circuit device.

Figure 17:
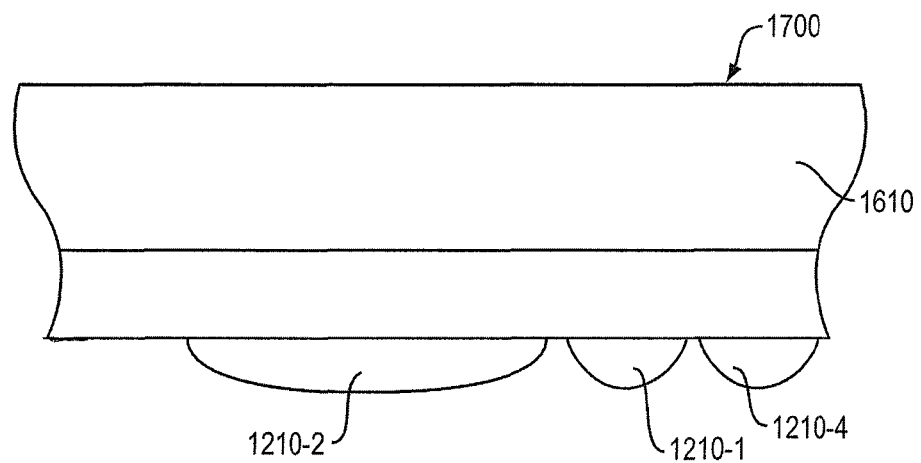
FIG. 17 is an example diagram illustrating a side view of an electronic circuit package according to embodiments herein.
Figure 18A:
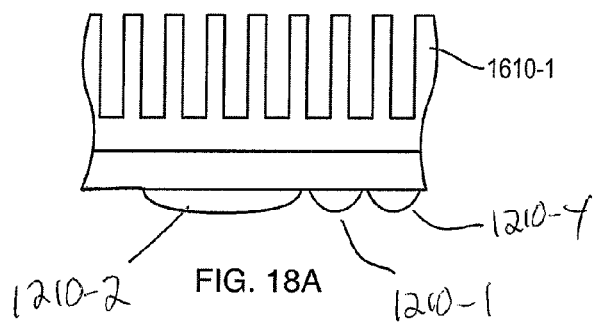
FIGS. 18A, 18B, 18C, 18D are example diagrams illustrating shapes of different heat sink options according to embodiments herein.
Figure 18B:
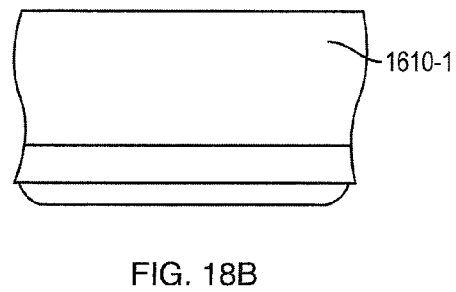
Figure 18C:
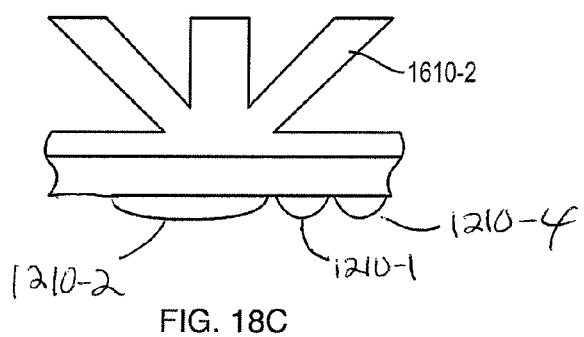
Figure 18D:
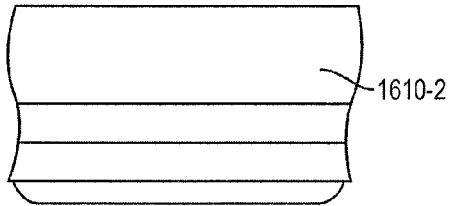

FIG. 17 is an example diagram illustrating a side view of an electronic circuit package after removal of the substrate 110 and singulation according to embodiments herein.

As shown, the electronic circuit package 1700 includes plate 1610. In a manner as previously discussed, contacts 1210 disposed on the underfacing of the electronic circuit package 1700 provide connectivity to the circuit device 210-1 and mass of conductive material 212-1.

Figure 19:
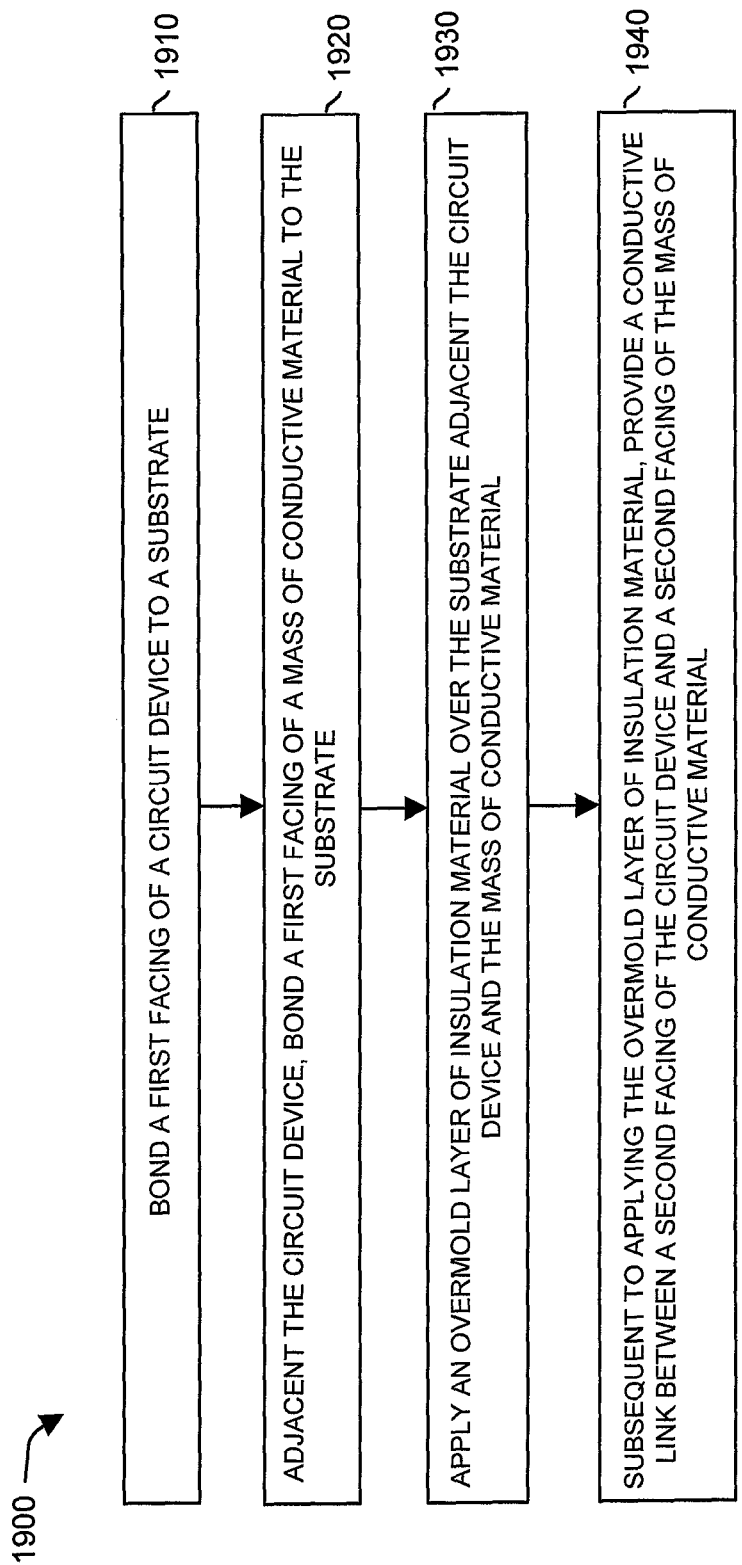
FIG. 19 is an example diagram illustrating of a method of fabricating according to embodiments herein.

FIG. 19 is an example diagram illustrating steps of fabricating an electronic circuit package according to embodiments herein.

In processing block 1910, an assembler bonds the facing 310-1 of the circuit device 210-1 to substrate 110.

In processing block 1920, adjacent the circuit device 210-1, the assembler bonds the facing 312-1 of the mass of conductive material 212-1 to the substrate 110.

In processing block 1930, the assembler applies an overmold layer 430 of insulation material 420 over the substrate 110 adjacent the circuit device 210-1 and the mass of conductive material 212-1. The overmold layer may initially be liquid and then turn into solid material.

In processing block 1940, subsequent to applying the overmold layer 430 of insulation material 420, the assembler provides a conductive link (e.g., material 610) between facing 510-2 of the circuit device 210-1 and facing 512-2 of the mass of conductive material 212-1.

FIG. 20 is a flowchart 2000 illustrating an example diagram of fabricating an electronic circuit package according to embodiments herein.

In processing block 2010, the assembler bonds a facing 310-1 of the circuit device 210-1 to substrate 110.

In processing block 2020, adjacent the circuit device 210-1, the assembler bonds a facing 312-1 of the mass of conductive material 212-1 to the substrate 110.

In processing block 2030, the assembler applies an overmold layer 430 of insulation material 420 over the substrate 110 adjacent the circuit device 210-1 and the mass of conductive material 212-1. In one embodiment, the insulation material 420 fills the void between the circuit device 210-1 and the mass of conductive material 212-1.

In processing block 2040, subsequent to applying the overmold layer 430 of insulation material 420 to the substrate 110 and before providing the conductive link via layer of material 610, the assembler reduces a thickness of the circuit device 210-1 and the mass of conductive material 212-1.

In processing block 2050, the assembler removes a portion of material from the circuit device 210-1 to expose the facing 510-2 of the circuit device 210-1.

In processing block 2060, the assembler removes a portion of material from the mass of conductive material 212-1 to expose the facing 512-2 of the mass of conductive material 212-1.

In processing block 2070, subsequent to applying the overmold layer 430 of insulation material 420, the assembler provides a conductive link (via layer of material 610) between a facing 510-2 of the circuit device 210-1 and a facing 512-2 of the mass of conductive material 212-1. The facing 510-2 of the circuit device 210-1 is disposed substantially opposite the facing 310-1 of the circuit device 210-1. The facing 512-2 of the mass of conductive material 212-1 is disposed substantially opposite the facing 312-1 of the mass of conductive material 212-1.

In processing block 2080, subsequent to providing the conductive link or path (e.g., layer of material 610) between the facing 510-2 of the circuit device 210-1 and the facing 512-2 of the mass of conductive material 212-1, the assembler applies an overmold layer 430 over a combination of the conductive link (e.g., layer of material 610) and the overmold layer 430.

In processing block 2090, the assembler removes the substrate 110 and/or adhesive layer 115 to expose: i) the facing 310-1 of the circuit device 210-1, and ii) the facing 310-2 of the mass of conductive material 212-1.

As discussed herein, techniques herein are well suited for use in electronic circuit package fabrication and power supply circuitry. However, it should be noted that embodiments herein are not limited to use in such applications and that the techniques discussed herein are well suited for use in other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. A multi-layer wafer level assembly comprising:
a first layer, the first layer including a temporary fabrication substrate;
a second layer coupled to a facing of the first layer, the second layer including: a mass of conductive material, a circuit device, and insulation material;
a thickness of the circuit device extending from a first surface region on the facing of the first layer to an exposed surface facing of the second layer, the exposed surface facing disposed on the second layer opposite a respective surface of the second layer coupled to the facing of the first layer;
a thickness of the mass of conductive material extending from a second surface region on the facing of the first layer to the exposed surface facing of the second layer;
the insulation material disposed in the second layer between the circuit device and the mass of conductive material; and
wherein the exposed surface facing of the second layer is openly accessible to apply an electrically conductive link on the exposed surface facing between the circuit device and the conductive material.

2. The wafer level assembly as in claim 1, wherein the first layer is substantially planar; and
wherein the second layer is substantially planar.

3. The wafer level assembly as in claim 1, wherein the second layer as measured between the respective surface of the second layer to the exposed surface facing of the second layer is between 5 and 300 micrometers thick.

4. The wafer level assembly as in claim 1, wherein the mass of conductive material is a diode.

5. The wafer level assembly as in claim 1, wherein the mass of conductive material is metal.

6. The wafer level assembly as in claim 1, wherein the insulation material is a remaining part of an overmold layer applied over the circuit device, the overmold layer above the circuit device removed to expose the surface facing of the second layer.

7. The wafer level assembly as in claim 1, wherein the circuit device disposed in the second layer is a vertical field effect transistor device;
wherein a gate node of the vertical field effect transistor substantially contacts the first surface region on the first layer;
wherein a source node of the vertical field effect transistor substantially contacts the second surface region on the first layer; and
wherein the exposed surface facing of the second layer is openly accessible for further fabrication of the electrically conductive link between an exposed surface of the circuit device and an exposed surface of the conductive material, both the exposed surface of the circuit device and the exposed surface of the conductive material disposed on the exposed surface facing of the second layer.

8. The wafer level assembly as in claim 7, wherein a thickness of the insulation material extends from a third surface region on the facing of the first layer to the exposed surface facing of the second layer.

9. The wafer level assembly as in claim 1, wherein the exposed surface facing of the second layer is openly exposed as a surface on a remaining portion of thinned material, the remaining portion of thinned material including the circuit device, the insulation material, and the mass of conductive material.

10. The wafer level assembly as in claim 1, wherein a thickness of the insulation material extends from a third surface region on the facing of the first layer to the exposed surface facing of the second layer.

11. The wafer level assembly as in claim 1, wherein the circuit device is an initial fabrication of a vertical field effect transistor device including a gate node and a source node but lacking a drain node.

12. The wafer level assembly as in claim 1, wherein the second layer represents a remaining portion of thinning a thicker layer that is grinded away to produce the exposed surface facing of the second layer.

13. The wafer level assembly as in claim 1, wherein the second layer represents a remaining thinned version of the circuit device and mass of conductive material disposed on the temporary substrate after removal of material; and
wherein an $RDS_{ON}$ of the circuit device is controlled by the thickness of the circuit device extending from the first surface region on the first layer and the exposed surface facing of the second layer.

14. The wafer level assembly as in claim 1, wherein the mass of conductive material is a diode, a first terminal of the diode disposed on the second surface region on the facing of the first layer, the second terminal of the diode disposed on the exposed surface facing of the second layer.

15. The wafer level assembly as in claim 14, wherein the mass of conductive layer material is doped with a P-type material; and
wherein the second terminal end of the diode is doped with an N-type material.

16. The wafer level assembly as in claim 14, wherein the mass of conductive layer material is doped with an N-type material; and
wherein the second terminal end of the diode is doped with a P-type material.

17. The wafer level assembly as in claim 1, wherein the circuit device is a field effect transistor device; and
wherein an $RDS_{ON}$ of the field effect transistor device is controlled by the thickness of the circuit device extending from the first surface region on the first layer to the exposed surface facing of the second layer.

18. A multi-layer wafer level assembly comprising:
a first layer, the first layer including a temporary fabrication substrate;
a second layer coupled to a facing of the first layer, the second layer including: a mass of conductive material, a circuit device, and insulation material;
a thickness of the circuit device extending from a first surface region on the facing of the first layer to an exposed surface facing of the second layer, the exposed surface facing disposed on the second layer opposite a respective surface of the second layer coupled to the facing of the first layer;

a thickness of the mass of conductive material extending from a second surface region on the facing of the first layer to the exposed surface facing of the second layer;

the insulation material disposed in the second layer between the circuit device and the mass of conductive material;

wherein the circuit device is a preliminary fabrication of a vertical field effect transistor device;

wherein a gate node of the vertical field effect transistor substantially contacts the first surface region on the facing of the first layer;

wherein a source node of the vertical field effect transistor substantially contacts the second surface region on the facing of the first layer; and wherein a side of the vertical field effect transistor is accessible from the exposed surface facing of the second layer to create a drain node of the vertical field effect transistor device.

19. The wafer level assembly as in claim 18, wherein the exposed surface facing of the second layer is openly accessible to apply an electrically conductive link on the exposed surface facing between the circuit device and the conductive material.

20. The wafer level assembly as in claim 18, wherein the exposed surface facing of the second layer includes an openly accessible surface of the conductive material and an openly accessible surface of the circuit device, the openly accessible surface of the conductive material disposed on a same planar facing as the openly accessible surface of the conductive material.

21. A multi-layer wafer level assembly comprising:

a first layer, the first layer including a temporary fabrication substrate;

a second layer coupled to a facing of the first layer, the second layer including: a mass of conductive material, a circuit device, and insulation material;

a thickness of the circuit device extending from a first surface region on the facing of the first layer to an exposed surface facing of the second layer, the exposed surface facing disposed on the second layer opposite a respective surface of the second layer coupled to the facing of the first layer;

a thickness of the mass of conductive material extending from a second surface region on the facing of the first layer to the exposed surface facing of the second layer;

the insulation material disposed in the second layer between the circuit device and the mass of conductive material;

wherein the circuit device is an initial fabrication of a vertical field effect transistor device, the initial fabrication of the vertical field effect transistor device including a gate node and a source node but lacking a drain node;

wherein the gate node of the vertical field effect transistor contacts the first surface region of the first layer; and wherein the source node of the vertical field effect transistor contacts the second surface region of the first layer.

22. The wafer level assembly as in claim 21, wherein a portion of the circuit device is accessible from the exposed surface facing of the second layer to create the drain node on the vertical field effect transistor.

23. A multi-layer wafer level assembly comprising:

a first layer, the first layer including a temporary fabrication substrate;

a second layer coupled to the first layer, the second layer including: a mass of electrically conductive material, a circuit device, and insulation material;

the circuit device including a gate node and a source node but lacking a drain node;

the insulation material disposed in the second layer between the circuit device and the mass of electrically conductive material;

a thickness of the circuit device extending from a first surface region on an unexposed facing of the first layer to an exposed surface facing of the second layer disposed opposite the unexposed facing of the first layer;

a thickness of the mass of conductive material extending from a second surface region on the unexposed facing of the first layer to the exposed surface facing of the second layer opposite the unexposed facing of the first layer; and a thickness of the insulation material extending from a third surface region on the unexposed facing of the first layer to the exposed surface facing of the second layer opposite the unexposed facing of the first layer.

* * * * *